United States Patent
Sethuraman et al.

(10) Patent No.: US 6,302,766 B1
(45) Date of Patent: *Oct. 16, 2001

(54) SYSTEM FOR CLEANING A SURFACE OF A DIELECTRIC MATERIAL

(75) Inventors: Anantha R. Sethuraman, Fremont; William W. C. Koutny, Jr., Santa Clara, both of CA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/394,819

(22) Filed: Sep. 13, 1999

Related U.S. Application Data

(62) Division of application No. 09/144,353, filed on Aug. 31, 1998, now Pat. No. 5,972,124.

(51) Int. Cl.[7] .................................................. B24B 1/00
(52) U.S. Cl. .................................................. 451/41; 451/60
(58) Field of Search .................................. 451/28, 41, 285, 451/286, 287, 288, 289, 526, 527, 529, 539, 60, 446

(56) References Cited

U.S. PATENT DOCUMENTS

| | | |
|---|---|---|
| 3,629,023 | 12/1971 | Strehlow . |
| 3,979,239 | 9/1976 | Walsh . |
| 4,010,583 | 3/1977 | Highberg . |

(List continued on next page.)

FOREIGN PATENT DOCUMENTS 0 303 061    2/1989   (EP) .

OTHER PUBLICATIONS

Singer, "CMP Developers Take Aim at STI Application" and "Slurry–Free CMP Reduces Dishing, Speeds Process," *Semiconductor International*, vol. 21, No. 2, p. 40.

Ali et al., "Chemical–Mechanical Polishing of Interlayer Dielectric: A Review," *Solid State Technology*, Oct. 1994, pp. 63–68.

(List continued on next page.)

*Primary Examiner*—Derris H. Banks
(74) *Attorney, Agent, or Firm*—Kevin L. Daffer; Conley, Rose & Tayon P.C.

(57) ABSTRACT

The present invention provides a method for cleaning particles from a semiconductor topography that has been polished using a fixed-abrasive polishing process by applying a cleaning solution including either (a) an acid and a peroxide or (b) an acid oxidant to the topography. According to an embodiment, a semiconductor topography is polished by a fixed-abrasive process in which the topography is pressed face-down on a rotating polishing pad having particles embedded in the pad while a liquid absent of particulate matter is dispensed onto the pad. The particles may include, e.g., cerium oxide, cerium dioxide, $\alpha$alumina, $\gamma$alumina, silicon dioxide, titanium oxide, chromium oxide, or zirconium oxide. A cleaning solution comprising either (a) an acid and a peroxide, e.g., hydrogen peroxide, or (b) an acid oxidant is applied to the semiconductor topography after the polishing process is completed. Examples of acids that may be used include, but are not limited to, sulfuric acid, hydrochloric acid, hydrobromic acid, hydrofluoric acid, formic acid, acetic acid, nitric acid, perchloric acid, perbromic acid, performic acid, phosphoric acid, and peracetic acid Advantageously, the cleaning solution effectively eliminates all or at least a significant portion of the particles on the semiconductor topography.

21 Claims, 2 Drawing Sheets

U.S. PATENT DOCUMENTS

| | | |
|---|---|---|
| 4,193,226 | 3/1980 | Gill, Jr. et al. . |
| 4,256,535 | 3/1981 | Banks . |
| 4,261,791 | 4/1981 | Shwartzman . |
| 4,373,991 | 2/1983 | Banks . |
| 4,393,628 | 7/1983 | Ottman et al. . |
| 4,505,720 | 3/1985 | Gabor et al. . |
| 4,600,469 | 7/1986 | Fusco et al. . |
| 4,677,043 | 6/1987 | Cordes, III et al. . |
| 4,768,883 | 9/1988 | Waldo et al. . |
| 4,778,532 | 10/1988 | McConnell et al. . |
| 4,789,648 | 12/1988 | Chow et al. . |
| 4,811,522 | 3/1989 | Gill, Jr. . |
| 4,879,258 | 11/1989 | Fisher . |
| 4,933,715 | 6/1990 | Yamada et al. . |
| 4,944,836 | 7/1990 | Beyer et al. . |
| 4,954,141 | 9/1990 | Takiyama et al. . |
| 4,956,313 | 9/1990 | Cote et al. . |
| 4,962,423 | 10/1990 | Yamada et al. . |
| 4,968,381 | 11/1990 | Prigge et al. . |
| 4,986,878 | 1/1991 | Malazgirt et al. . |
| 5,032,203 | 7/1991 | Doy et al. . |
| 5,057,462 | 10/1991 | Eisenberg et al. . |
| 5,064,683 | 11/1991 | Poon et al. . |
| 5,084,419 | 1/1992 | Sakao . |
| 5,209,816 | 5/1993 | Yu et al. . |
| 5,262,354 | 11/1993 | Cote et al. . |
| 5,273,558 | 12/1993 | Nelson et al. . |
| 5,288,333 | 2/1994 | Tanaka et al. . |
| 5,294,570 * | 3/1994 | Fleming, Jr. et al. ............... 437/239 |
| 5,312,777 | 5/1994 | Cronin et al. . |
| 5,320,706 | 6/1994 | Blackwell . |
| 5,320,978 | 6/1994 | Hsu . |
| 5,340,370 | 8/1994 | Cadien et al. . |
| 5,346,584 | 9/1994 | Nasr et al. . |
| 5,362,668 | 11/1994 | Tasaka . |
| 5,362,669 | 11/1994 | Boyd et al. . |
| 5,363,550 | 11/1994 | Aitken et al. . |
| 5,376,482 | 12/1994 | Hwang et al. . |
| 5,389,194 | 2/1995 | Rostoker et al. . |
| 5,389,579 | 2/1995 | Wells . |
| 5,392,361 | 2/1995 | Imaizumi et al. . |
| 5,395,801 | 3/1995 | Doan et al. . |
| 5,397,741 | 3/1995 | O'Connor et al. . |
| 5,401,691 | 3/1995 | Caldwell . |
| 5,406,111 | 4/1995 | Sun . |
| 5,435,772 | 7/1995 | Yu . |
| 5,436,488 | 7/1995 | Poon et al. . |
| 5,441,094 | 8/1995 | Pasch . |
| 5,453,639 | 9/1995 | Cronin et al. . |
| 5,459,096 | 10/1995 | Venkatesan et al. . |
| 5,468,983 | 11/1995 | Hirase et al. . |
| 5,486,265 | 1/1996 | Salugsugan . |
| 5,492,858 | 2/1996 | Bose et al. . |
| 5,494,857 | 2/1996 | Cooperman et al. . |
| 5,503,962 | 4/1996 | Caldwell . |
| 5,525,840 | 6/1996 | Tominaga . |
| 5,531,861 | 7/1996 | Yu et al. . |
| 5,541,427 | 7/1996 | Chappell et al. . |
| 5,551,986 | 9/1996 | Jain . |
| 5,573,633 | 11/1996 | Gambino et al. . |
| 5,578,523 | 11/1996 | Fiordalice et al. . |
| 5,591,239 | 1/1997 | Larson et al. . |
| 5,595,937 | 1/1997 | Mikagi . |
| 5,602,423 | 2/1997 | Jain . |
| 5,607,345 | 3/1997 | Barry et al. . |
| 5,616,513 | 4/1997 | Shepard . |
| 5,629,242 | 5/1997 | Nagashima et al. . |
| 5,643,406 | 7/1997 | Shimomura et al. . |
| 5,643,823 | 7/1997 | Ho et al. . |
| 5,643,836 | 7/1997 | Meister et al. . |
| 5,652,176 | 7/1997 | Maniar et al. . |
| 5,656,097 | 8/1997 | Olesen et al. . |
| 5,662,769 * | 9/1997 | Schonauer et al. ................... 438/633 |
| 5,664,990 | 9/1997 | Adams et al. . |
| 5,665,202 | 9/1997 | Subramanian et al. . |
| 5,666,985 | 9/1997 | Smith, Jr. et al. . |
| 5,676,587 | 10/1997 | Landers et al. . |
| 5,695,572 * | 12/1997 | Brunner et al. .......................... 134/3 |
| 5,702,977 | 12/1997 | Jang et al. . |
| 5,721,172 | 2/1998 | Jang et al. . |
| 5,728,308 | 3/1998 | Muroyama . |
| 5,776,808 | 7/1998 | Muller et al. . |
| 5,786,260 | 7/1998 | Jang et al. . |
| 5,837,612 | 11/1998 | Ajuria et al. . |
| 5,906,532 | 5/1999 | Nakajima et al. . |
| 5,919,082 | 7/1999 | Walker et al. . |
| 5,928,959 | 7/1999 | Huckels et al. . |
| 5,943,590 | 8/1999 | Wang et al. . |
| 5,952,687 | 9/1999 | Kawakubo et al. . |
| 5,963,841 | 10/1999 | Karlsson et al. . |
| 5,972,124 * | 10/1999 | Sethuraman et al. .................... 134/7 |
| 5,972,792 | 10/1999 | Hudson . |
| 6,010,964 | 1/2000 | Glass . |
| 6,016,000 | 1/2000 | Moslehi . |
| 6,042,996 | 3/2000 | Lin et al. . |

OTHER PUBLICATIONS

Sivaram et al., "Developments in Consumables Used in the Chemical Mechanical Polishing of Dielectrics," *International Conference on Solid State Devices & Materials*, Aug. 1995, p. 166.

Malkoe et al., "Effect of Retaining Ring System on the Polishing of 300 mm Oxide Wafers," Mar. 2001, pp. 519–522.

* cited by examiner

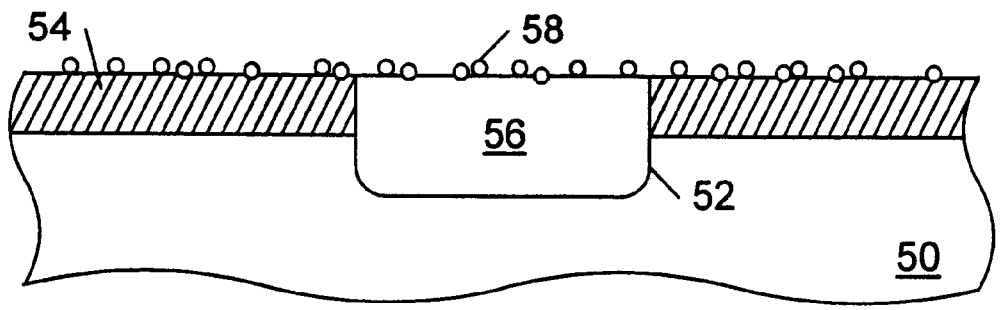

FIG. 3

```
┌─────────────────────────────────────┐
│ Apply a solution comprising either (a) │
│   an acid and a peroxide or (b) an    │
│  oxidizing acid to the semiconductor  │
│    topography after polishing         │
│                60                     │
└─────────────────────────────────────┘
                  │
                  ▼
┌─────────────────────────────────────┐
│  Rinse the semiconductor topography  │
│         in deionized water           │
│                62                    │
└─────────────────────────────────────┘
                  │
                  ▼
┌─────────────────────────────────────┐
│  Dry the topography by spinning it at │
│    relatively high speeds in a       │
│          spin/rinse dryer            │
│                64                    │
└─────────────────────────────────────┘
```

FIG. 4

SYSTEM FOR CLEANING A SURFACE OF A DIELECTRIC MATERIAL

This is a Divisional of application Ser. No. 09-144,353, filed Aug. 31, 1998 now U.S. Pat. No. 5, 972, 124.

BACKGROUND OF THE INVENTION

1. Field of the Invention

This invention relates to integrated circuit manufacturing, and more particularly, to a method for cleaning particles from a semiconductor topography that has been polished using a fixed-abrasive polishing process, wherein the particles are provided to the topography from an abrasive polishing surface. The particles are removed from the semiconductor topography by applying a cleaning solution to the topography using either (a) an acid and a peroxide or (b) an acid oxidant.

2. Description of the Relevant Art

Fabrication of an integrated circuit involves numerous processing steps. After implant regions (e.g., source/drain regions) have been placed within a semiconductor substrate and gate areas defined upon the substrate, an interlevel dielectric is formed across the topography to isolate the gate areas and the implant regions from overlying conducting regions. Interconnect routing is then placed over the interlevel dielectric and connected to the implant regions and/or the gate areas by ohmic contacts formed through the interlevel dielectric. Alternating levels of interlevel dielectric and interconnect may be placed across the semiconductor topography to form a multi-level integrated circuit.

As successive layers are deposited across previously patterned layers of an integrated circuit, elevational disparities develop across the surface of each layer. If left unattended, the elevational disparities in each level of an integrated circuit can lead to various problems. For example, when a dielectric, conductive, or semiconductive material is deposited over a topological surface having elevationally raised and recessed regions, step coverage problems may arise. Step coverage is defined as a measure of how well a film conforms over an underlying step and is expressed by the ratio of the minimum thickness of a film as it crosses a step to the nominal thickness of the film over horizontal regions. Also, stringers may arise from incomplete etching over severe steps. Furthermore, correctly patterning layers upon a topological surface containing fluctuations in elevation may be difficult using optical lithography. The depth-of-focus of the lithography alignment system may vary depending upon whether the resist resides in an elevational "hill" or "valley" area The presence of such elevational disparities therefore makes it difficult to print high resolution features.

Chemical-mechanical polishing ("CMP") is a technique commonly employed to planarize or remove the elevational fluctuations in the surface of a semiconductor topography. A conventional CMP process involves placing a semiconductor wafer face-down on a polishing pad which lies on or is attached to a rotatable table or platen. A popular polishing pad medium comprises polyurethane or polyurethane-impregnated polyester felts. During the CMP process, the polishing pad and the semiconductor wafer are rotated relative to each other as the wafer is forced against the pad. An abrasive, fluid-based chemical suspension, often referred to as a "slurry", is deposited onto the surface of the polishing pad. The slurry fills the space between the polishing pad and the wafer surface such that a chemical in the slurry may react with the surface material being polished. The rotational movement of the polishing pad relative to the wafer causes abrasive particles entrained within the slurry to physically strip the reacted surface material from the wafer. The pad itself may also physically remove some material from the surface of the semiconductor topography.

In order to achieve planarization of the semiconductor topography, elevationally raised regions must be removed at a substantially faster rate than elevationally recessed regions. Unfortunately, the difference in polish rate that can be achieved between the high elevation regions and the low elevation regions is somewhat limited by the use of a slurry in the conventional CMP process. In particular, the slurry, being a relatively viscous fluid, flows to the elevationally recessed regions of the topography where it can react with the surface material, releasing it from bondage with the bulk of the material. Because of the toxic nature of some of its effluent components, the slurry waste must be disposed of and subjected to waste treatment after planarization is complete. The disposal and waste treatment of the slurry effluent significantly increases the cost of manufacturing an integrated circuit.

To avoid the problems associated with the conventional CMP process, a more recently developed polishing process known as the "fixed-abrasive" polishing process may be employed to planarize a semiconductor topography. The fixed-abrasive process involves placing a liquid which is substantially free of particulate matter between the surface of the topography and an abrasive polishing surface of a rotating polishing pad. Since no slurry is required, the time consuming and costly disposal of such a slurry may be avoided.

The liquid applied to the polishing surface in a fixed abrasive process may comprise deionized water or an acid diluted with water, depending upon the features of the topography being polished. The polishing surface comprises a polymer-based matrix entrained with particles selected from the group consisting of cerium oxide, cerium dioxide, aluminum oxide, silicon dioxide, titanium oxide, chromium oxide, and zirconium oxide. The abrasive polishing surface belongs to a polishing pad that is substantially resistant to deformation even when placed across an elevationally recessed region of relatively large lateral dimension (e.g., over 200 microns lateral dimension). Therefore, the pad is non-conformal to the underlying surface and thus does not come in contact with elevationally recessed regions of the surface. It is believed that the particles dispersed throughout the abrasive polishing surface in combination with the polishing liquid interact chemically and physically with the elevated regions of the topography to remove those regions. However, the liquid alone is believed to be incapable of removing the topography in elevationally recessed regions. Therefore, preferential removal of high elevation regions relative to low elevation regions is possible using the fixed-abrasive polishing process.

Some of the particles in the abrasive polishing surface of the polishing pad may be dislodged from the surface during polishing. The particles may thus accumulate upon the surface of the semiconductor topography being polished. Adhesion forces between dielectric surfaces (e.g., silicon dioxide) and the particles (e.g., $CeO_2$) are quite strong, such that the particles particularly adsorb on dielectric surfaces. It is believed that a high zeta potential, i.e., electric static or charge difference, exists between the particles and the dielectric, causing the particles to "stick" to the dielectric. The presence of such particles on the semiconductor topography may scratch the surface of the topography and contaminate the ensuing integrated circuit. Considering the minute dimensions of integrated circuit features, even the tiniest defect in the semiconductor topography can render the ensuing integrated circuit inoperable.

A post-planarization cleaning process is therefore commonly employed to eliminate the abrasive particles from the semiconductor topography. The cleaning process typically involves three main steps. First, the polished surface of the semiconductor topography is buffed at a relatively low pressure for approximately 15 to 30 seconds using the polishing pad. Second, deionized water is directed to another pad softer than the polishing pad (e.g., a Politex Pad commercially available from Rodel Products Corp.) as the topography is buffed by the pad at a relatively low pressure for approximately 30 to 45 seconds. Unlike the polishing pad, this pad does not have particles fixed in the pad. Third, polyvinylalcohol ("PVA") brushes apply a solution comprising ammonium hydroxide and deionized water to the surface of the topography while concurrently mechanically scrubbing that surface for approximately 60 to 90 seconds. A special machine (e.g., the SYNERGY Integra™ commercially available from OnTrak Systems Inc.) is needed to perform the PVA brush scrub step.

The post-planarization cleaning process has several drawbacks, for example, some particles nonetheless remain on the surface of the polished semiconductor topography once the cleaning process is completed. The presence of such particles may be detrimental to the operation of the ensuing integrated circuit. Furthermore, the combined costs of the machine, the PVA brushes, and the extra pad required for the post-planarization cleaning procedure are relatively high. Also, the number of wafers that may be cleaned at the same time is somewhat limited by the number of tools having the pads and brushes required for the cleaning. Further, the number of wafers that may be buffed on a single pad is generally 5 or less. The considerable amount of time required to clean all of the wafers being processed might be better spent fabricating subsequent layers of those wafers. It would therefore be desirable to develop a more effective, cheaper, and faster post-planarization cleaning process.

SUMMARY OF THE INVENTION

The problems outlined above are in large part solved by an embodiment of the present invention for cleaning particles from a semiconductor topography that has been polished using a fixed-abrasive polishing process. The particles are provided to the topography from an abrasive polishing surface of a polishing pad. The particles are removed from the semiconductor topography by applying a cleaning solution comprising either (i) an acid and a peroxide or (ii) an acid oxidant. Advantageously, the cleaning solution effectively eliminates all (or at least a significant portion) of the particles on the semiconductor topography. Although buffing steps may be performed, such steps are unnecessary. As such, the cleaning process does not require expensive specialized tools, pads, and brushes. Moreover, the simplicity of this cleaning process ensures tat integrated circuit production throughput does not suffer from the downtime of malfunctioning equipment. Further, since multiple wafers may be cleaned simultaneously by, e.g., placing the wafers in a multiple wafer carrier and then dipping the wafer carrier in a container holding the cleaning solution, the throughput is improved.

According to one embodiment, a semiconductor topography is polished by the fixed-abrasive process. That is, the topography is pressed face-down on a rotating polishing pad having particles embedded in the pad while a liquid absent of particulate matter is dispensed onto the pad. The particles may comprise, e.g., cerium oxide, cerium dioxide, $\alpha$ alumina ($\alpha$ aluminum oxide), $\gamma$ alumina ($\gamma$ aluminum oxide), silicon dioxide, titanium oxide, chromium oxide, or zirconium oxide. The levels of an ensuing integrated circuit that are located beneath the first interconnect level may be fabricated using such polishing. For example, the polishing process may be employed to form shallow trench isolation structures comprising a dielectric, such as silicon dioxide between ensuing active areas of a semiconductor substrate. In addition, the planarization of an interlevel dielectric, e.g., a poly-metal dielectric ("PMD"), placed over polycrystalline silicon ("polysilicon") gate electrodes and a semiconductor substrate may be achieved by the fixed-abrasive polishing process. The interlevel dielectric comprises a glass- or silicate-based material, such as silicon dioxide.

Particles embedded in the abrasive polishing surface of the polishing pad may be dislodged from the pad during the polishing process. It is believed that the zeta potential between such particles and dielectric materials, such as oxide or nitride, is sufficient to cause adhesion of the particles to a dielectric source of the semiconductor topography. The particles may also possibly adsorb on other types of surfaces, e.g., a semiconductor substrate surface or a polysilicon surface. The particles may be removed from the semiconductor topography by applying a cleaning solution comprising an acid to the topography. Examples of acids that may be used include, but are not limited to, hydrochloric acid, hydrobromic acid, hydrochloric acid, formic acid, and acetic acid. Preferably, the acid in the cleaning solution is sulfuric acid. The cleaning solution may also comprise a peroxide, e.g., hydrogen peroxide. Although it is believed that the volumetric ratio of the acid to the peroxide is not critical to the success of the cleaning process, the volumetric dilution ratio of acid to peroxide may range from approximately 10:1 to 200:1. In the instance that the acid is also an oxidant, e.g., nitric acid, perchloric acid, perbromic acid, performic acid, phosphoric acid, and peracetic acid, it is postulated that peroxide may be left out of the cleaning solution. Because the cleaning solution might attack and remove metals, it may be best to avoid applying such a solution to a semiconductor topography comprising metal. As such, the cleaning process may only be used after planarization of layers fabricated before the interconnect levels of the ensuing integrated circuit.

The effectiveness of the process is believed to be non-sensitive to the length of time that the cleaning solution is applied to the topography. This length of time, however, may range from approximately 1 to 30 minutes. Application of the cleaning solution to the topography may be achieved using various methods. For example, the semiconductor topography may be placed in a wafer carrier which is then immersed into the cleaning solution. Alternatively, the cleaning solution may be sprayed from a nozzle or dispensed from a conduit onto the topography. As a result of being exposed to the cleaning solution, the particles adsorbed on the surface of the topography are removed. It is postulated that the cleaning solution alters the zeta potential of the topological surface such that the electric static difference between the particles and the surface is deceased. Accordingly, the particles no longer stick to the semiconductor topography, and thus may be easily washed from the topography. The cleaning solution may be rinsed from the topography using deionized water and then placed in a spin/rinse dryer that rotates the topography. Water may be dispensed onto the topography while it is being rotated. The topography may then be dried by spinning it at a relatively high speed.

BRIEF DESCRIPTION OF THE DRAWINGS

Other objects and advantages of the invention will become apparent upon reading the following detailed description and upon reference to the accompanying drawings in which:

FIG. 3 depicts a cross-sectional view of a semiconductor topography that is polished using the fixed-abrasive polishing process, wherein particles adsorb upon a dielectric during polishing; and FIG. 4 is a process flow diagram of a post-polish cleaning process that may be used to remove the particles from the topography.

Figure 1:
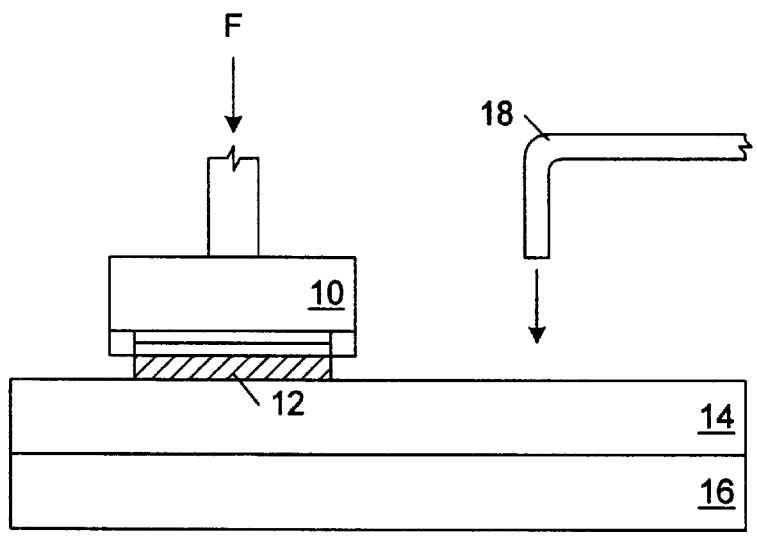
FIG. 1 is a side plan view of an apparatus that may be used to polish a semiconductor topography.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
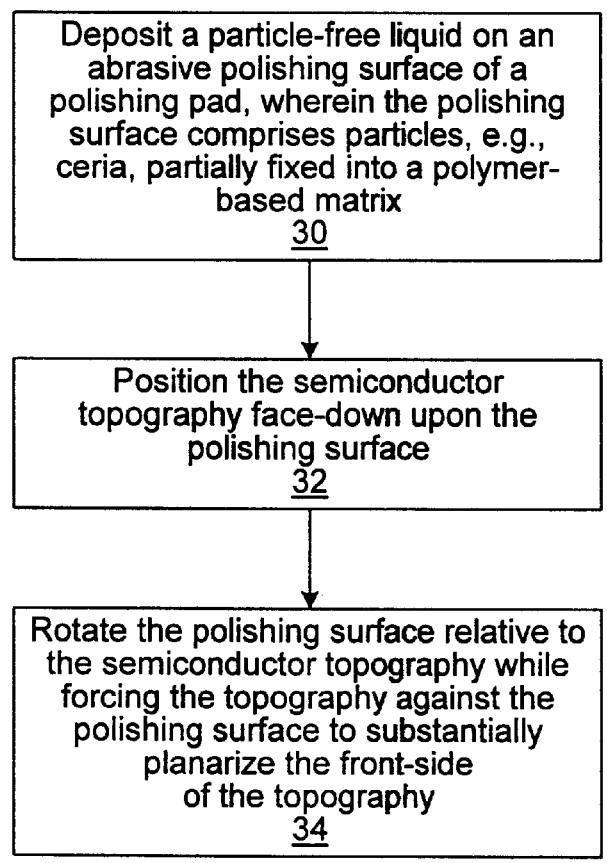
FIG. 2 is a process flow diagram of a fixed-abrasive polishing process that may be used to polish the conductive material.

FIG. 1 illustrates an exemplary apparatus that may be used to perform fixed-abrasive polishing of a semiconductor wafer. It is to be understood that other types of tools may be employed for the fixed-abrasive polishing process as well, and that different tools may differ in the number of wafers that may be polished simultaneously. Also, FIG. 2 shows the steps involved in the fixed-abrasive polishing process. As described in block 30 of FIG. 2, a liquid that is substantially free of particulate matter is deposited on an abrasive polishing surface of a polishing pad 14 which rests on and/or is attached to a rotatable platen 16. A conduit 18 positioned above polishing pad 14 may dispense the polishing liquid onto the pad. The polishing liquid may comprise, e.g., deionized water or a solution having a near-neutral pH. An appropriate polishing pad is commercially available from Minnesota Mining and Manufacturing Company. The polishing surface comprises a polymer-based matrix entrained with abrasive particles. Appropriate materials that may be used for the particles include, but are not limited to, ceria, $\alpha$ alumina, $\gamma$ alumina, silicon dioxide, titania, chromia, and zirconia.

As described in block 32 of FIG. 2, a semiconductor wafer 12 may be fixed to a wafer carrier 10 and pressed face-down on polishing pad 14 by a force, F, that is substantially perpendicular to the surface of the pad. As shown in block 34 of FIG. 2, polishing pad 14 is moved relative to the semiconductor wafer 12 to substantially planarize the frontside of the wafer. The polishing liquid may be continuously forwarded to the polishing surface during the polishing process. The polishing pad 14 is preferably rigid enough to withstand deformation under pressure so that it will not flex into valley areas of the topological surface of wafer 12. Further, the polishing liquid has no particles to interact with and possibly remove the surface material in the valley areas. As such, the surface material in those valley areas is unlikely to be physically stripped from the bulk material during the fixed-abrasive process. However, contact between the high elevation regions of the topological surface and the abrasive particles as well as the polishing liquid may cause the surface material in those elevated regions to be released from bondage with the bulk material. The particles extending from the abrasive polishing surface have a sufficient hardness to dislodge the reacted surface material during abrasion of the high elevation regions. Therefore, removal of elevationally raised regions is much faster than that of elevationally recessed regions, beneficially affording global planarization of the topography.

In an alternative embodiment, an acidic liquid serves as the polishing liquid during the fixed-abrasive polishing process. According to an exemplary application, the acidic liquid allows a silicon nitride ("nitride") layer to function as a polish stop while polishing an oxide layer formed over the nitride layer. The removal of an oxide from nitride layer overlying a semiconductor substrate is common to the well-known shallow trench isolation process. A polish selectivity of oxide to nitride which is greater than 20:1 maybe achieved by adjusting the pH of the acidic liquid to between approximately 6.0 and 7.0. An acid including, but not limited to nitric acid, sulfuric acid, acetic acid, hydrofluoric acid, and hydrochloric acid may be slightly diluted with water to achieve the desired pH value. It is postulated that the reaction rate between the acidic liquid and the oxide is substantially greater than the reaction rate between the acidic liquid and the nitride. Thus, when exposed to the acidic liquid, oxide may be transformed into a new compound which is readily dislodged from the semiconductor topography by the abrasive polishing surface. The oxide layer thus may be poihed at a substantially faster rate than the nitride layer residing beneath the oxide layer.

FIG. 3 illustrates an exemplary semiconductor topography that has been polished using the fixed-abrasive polishing process. The topography includes a semiconductor substrate 50 comprising a bulk semiconducting material, such as Si, SiGe, Ge, GaAs, SiGeAs, upon which subsequent thin films are deposited and/or patterned. The semiconducting material may be conventionally doped with N-type dopants, such as P, As, Sb, S, and Se, and/or with P-type dopants, such as B, and $BF_2$. A trench isolation structure 56 has been formed laterally between ensuing active areas of substrate 50, according to the example shown. Trench isolation structure 56 comprises a dielectric, e.g., a low dielectric constant material (K>4.1), such as oxide, fluorosilicate glass, silicon oxyfluoride, hydrogen silsesquioxane, fluorinated polysilicon, and fluoro-polymide. A nitride layer 54 is configured on the surface of substrate 50 exterior to trench isolation structure 56. A "pad" oxide layer may be interposed between substrate 50 and nitride layer 54 to reduce the mechanical stress between Si of substrate 50 and the nitride. As a result of being polished, the upper surface of trench isolation structure 56 is substantially coplanar with that of nitride layer 54. As shown, particles 58 provided from the abrasive polishing surface may become adsorbed on the topological surface during polishing thereof. It is believed that particles 58 and the dielectric surfaces are oppositely charged to the extent that they adhere to each other.

FIG. 4 illustrates a sequence of post-polish cleaning steps that may be employed to remove particles such as those depicted in FIG. 3 from the surface of a semiconductor topography. As shown in block 60, a cleaning solution comprising either (a) an acid and a peroxide, e.g., hydrogen peroxide, or (b) an acid oxidant is applied to the semiconductor topography after the polishing process is completed. Examples of acids that may be used include, but are not limited to, hydrochloric acid, hydrobromic acid, hydrofluoric acid, formic acid, and acetic acid. Preferably, the acid in the cleaning solution is sulfuric acid. The volumetric dilution ratio of acid to peroxide may range from, e.g., approximately 10:1 to 200:1. Appropriate acid oxidants include, but are not limited to, nitric acid, perchloric acid, perbromic acid, performic acid, phosphoric acid, and peracetic acid. The topography may be placed in contact with the cleaning solution for approximately 1 to 30 minutes. Unfortunately, the components of the cleaning solution might attack and remove metals. As such, the cleaning solution may only be applied to a semiconductor topography having no metal elements, such as metal interconnect.

Various methods may be used to apply the cleaning solution to the semiconductor topography. For example, the semiconductor topography may be placed in a container holding the cleaning solution. Alternatively, the cleaning solution may be sprayed from a nozzle or forwarded from a conduit to the topography. As a result of being exposed to the cleaning solution, the particles adsorbed on the surface of the topography are removed. It is postulated that the cleaning solution changes the zeta potential of the topological surface such that the charge difference between the particles and the surface is reduced. Accordingly, the particles are no longer strongly attracted to the semiconductor topography, and thus may be easily washed from the topography. The cleaning solution may then be rinsed from the topography using deionized water for a time period of, e.g., approximately 5 minutes, as shown by block 62 of FIG. 4 Thereafter, the topography may be placed in a spin/rinse dryer that rotates the topography as water is dispensed on the topography. The topography may then be dried by spinning it at a relatively high speed for a time period of, e.g., approximately 5 minutes, as indicated by block 64 of FIG. 4.

An experiment was run to test the feasibility of using only the cleaning solution hereof to clean particles from a polished surface. First and second topographies comprising oxide surfaces were polished using the fixed-abrasive polishing process, wherein the abrasive polishing surface included ceria particles. A conventional cleaning process was performed in which the oxide surface of the first topography was buffed with the fixed-abrasive polishing pad, polished with a Politex pad, and scrubbed with PVA brushes provided with a 2% solution of ammonia. Particles still remained on the oxide surface after the conventional cleaning process was completed. Some of these particles were analyzed and found to consist of ceria. The second topography was dipped in a 50:1 solution of sulfuric acid and hydrogen peroxide, resulting in the ceria particles being removed to leave a clean surface.

It will be appreciated to those skilled in the art having the benefit of this disclosure that this invention is believed to provide a method for cleaning particles from a semiconductor topography that has been polished using a fixed-abrasive polishing process by applying a cleaning solution comprsing either (a) an acid and a peroxide or (b) an acid ondant to the topography. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A polish cleaning mechanism, comprising:
   particles accumulated on a semiconductor topography from polishing the semiconductor topography with a liquid substantially free of particulate matter and a fixed-abrasive polishing surface; and
   a cleaning solution absent a slurry comprising an acid and a peroxide configured upon the semiconductor topography to remove the particles.

2. The mechanism of claim 1, wherein the acid comprises a chemical selected from the group consisting of sulfuric acid, hydrochloric acid, hydrobromic acid, hydrofluoric acid, nitric acid, formic acid, acetic acid, phosphoric acid, perchloric acid, perbromic acid, performic acid, peracetic acid.

3. The mechanism of claim 1, wherein the particles comprise a material selected from the group consisting of cerium oxide, cerium dioxide, aluminum oxide, silicon dioxide, titanium oxide, chromium oxide, and zirconium oxide.

4. The mechanism of claim 1, wherein the semiconductor topography comprises a dielectric surface.

5. The mechanism of claim 1, wherein the cleaning solution comprises the acid diluted with peroxide, and wherein a volumetric ratio of the acid to the peroxide ranges from approximately 10:1 to 200:1.

6. The mechanism of claim 1, wherein the acid is an acid oxidant.

7. The mechanism of claim 1, wherein an upper surface of the polished semiconductor topography is devoid of metal.

8. The mechanism of claim 1, wherein the fixed-abrasive polishing surface that is applied to the semiconductor topography includes abrasive particles at least partially fixed into a polymer-based matrix.

9. The mechanism of claim 1, wherein the particles comprise at least one member selected from the group consisting of abrasive particles from the fixed-abrasive polishing surface and particles from a material in/of the semiconductor topography.

10. The mechanism of claim 1, wherein the particles are provided from the fixed-abrasive polishing surface and are adsorbed on an upper surface of the semiconductor topography from polishing.

11. A polishing and cleaning mechanism, comprising:
    a fixed-abrasive polishing surface;
    particles accumulated on a semiconductor topography polished with the fixed-abrasive polishing surface and a liquid substantially free of particulate matter; and
    a cleaning solution comprising an acid and a peroxide configured upon the semiconductor topography to remove the particles.

12. The mechanism of claim 11, wherein the semiconductor topography is polished by applying a liquid substantially free of particulate matter between the semiconductor topography and the fixed-abrasive polishing pad.

13. The mechanism of claim 11, wherein the acid comprises a member selected from the group consisting of sulfuric acid, hydrochloric acid, hydrobromic acid, hydrofluoric acid, nitric acid, formic acid, acetic acid, phosphoric acid, perchloric acid, perbromic acid, performic acid, peracetic acid.

14. The mechanism of claim 11, wherein the particles comprise a material selected from the group consisting of cerium oxide, cerium dioxide, aluminum oxide, silicon dioxide, titanium oxide, chromium oxide, and zirconium oxide.

15. The mechanism of claim 11, wherein the semiconductor topography comprises a dielectric surface.

16. The mechanism of claim 11, wherein the cleaning solution comprises the acid diluted with peroxide, and wherein a volumetric ratio of the acid to the peroxide ranges from approximately 10:1 to 200:1.

17. The mechanism of claim 11, wherein the acid is an acid oxidant.

18. The mechanism of claim 11, wherein an upper surface of the polished semiconductor topography is devoid of metal.

19. The mechanism of claim 11, wherein the fixed-abrasive polishing surface comprises abrasive particles at least partially fixed into a polymer-based matrix.

20. The mechanism of claim 11, wherein the particles comprise at least one member selected from the group consisting of abrasive particles derived from the fixed-abrasive polishing surface and particles from a material in/of the semiconductor topography.

21. The mechanism of claim 11, wherein the particles are provided from the fixed-abrasive polishing surface and are adsorbed on an upper surface of the semiconductor topography from polishing.

* * * * *